US 9,293,728 B2

(12) United States Patent
Yu

(10) Patent No.: US 9,293,728 B2
(45) Date of Patent: Mar. 22, 2016

(54) ORGANIC LIGHT EMITTING DIODE DISPLAY DEVICE

(71) Applicant: LG Display Co., Ltd., Seoul (KR)

(72) Inventor: Jae-Hui Yu, Iksan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/709,701

(22) Filed: May 12, 2015

(65) Prior Publication Data

US 2015/0349289 A1 Dec. 3, 2015

(30) Foreign Application Priority Data

May 27, 2014 (KR) .......................... 10-2014-0063551

(51) Int. Cl.
G09F 13/04 (2006.01)
H01L 51/52 (2006.01)
H01L 27/32 (2006.01)
G02F 1/1335 (2006.01)
H01L 23/13 (2006.01)

(52) U.S. Cl.
CPC ...... *H01L 51/5243* (2013.01); *G02F 1/133602* (2013.01); *G02F 1/133608* (2013.01); *H01L 23/13* (2013.01); *H01L 27/32* (2013.01)

(58) Field of Classification Search
CPC ............... G02F 1/133002; G02F 1/133603; G02F 1/133604; G02F 1/133608; G02F 1/133602; H01L 23/13; H01L 23/053; H01L 27/32
USPC .......................................... 362/97.1; 257/40
See application file for complete search history.

(56) References Cited

U.S. PATENT DOCUMENTS

| 7,312,573 | B2 * | 12/2007 | Chang et al. ................. 313/512 |
| 8,897,035 | B2 * | 11/2014 | Lee .............................. 361/810 |
| 2009/0174317 | A1 * | 7/2009 | Jung et al. .................... 313/504 |
| 2009/0256471 | A1 * | 10/2009 | Kim et al. ..................... 313/504 |
| 2009/0267526 | A1 * | 10/2009 | Sung et al. ................. 315/169.3 |
| 2010/0259563 | A1 | 10/2010 | Tokuda et al. |
| 2012/0212966 | A1 * | 8/2012 | Wang et al. .................. 362/362 |
| 2014/0063403 | A1 * | 3/2014 | Chen et al. .................... 349/58 |

FOREIGN PATENT DOCUMENTS

| EP | 2 453 301 A2 | 5/2012 |
| JP | 2004-252251 A | 9/2004 |
| JP | 2010-231979 A | 10/2010 |

OTHER PUBLICATIONS

European Patent Office, Search Report and Opinion, European Patent Application No. 15169354.6, Aug. 11, 2015, nine pages.

* cited by examiner

*Primary Examiner* — Peggy Neils
(74) *Attorney, Agent, or Firm* — Fenwick & West LLP

(57) ABSTRACT

An organic light emitting display assembly includes a body frame and a cap frame that assembly to secure an organic light emitting diode panel with the assembled frame. A gap is present between a perimeter edge of the organic light emitting diode panel and the body frame to allow for convenient placement of the panel in the frame. The cap frame, attached over the body frame via an insertion groove, includes a cap horizontal portion that covers a top surface of the body vertical portion. One side surface of the cap horizontal portion of the cap frame covers the gap between the organic light emitting diode panel and the body frame.

19 Claims, 6 Drawing Sheets

ORGANIC LIGHT EMITTING DIODE DISPLAY DEVICE

CROSS-REFERENCE TO RELATED APPLICATION

This application claims the benefit under 35 U.S.C. §119 (a) of Korean Patent Application No. 10-2014-0063551, filed on May 27, 2014, in the Korean Intellectual Property Office, which is incorporated herein by reference in its entirety.

BACKGROUND

1. Technical Field

The present disclosure relates to an organic light emitting diode display device, and more particularly, to an organic light emitting diode display device having an improved appearance without an additional exterior case.

2. Discussion of the Related Art

An organic light emitting diode (OLED) display device includes an anode for injecting a hole, an organic emitting layer and a cathode for injecting an electron. The organic emitting layer emits a light due to transition of an exciton generated by combination of the hole and the electron in the organic emitting layer from an excited state to a ground state.

As a result, the OLED display device has an emissive type. Since an additional light source is not required for the OLED display device, a thickness and a weight of the OLED display device may be reduced. In addition, since the OLED display device has excellent properties such as a low power consumption, a high brightness and a high response speed, the OLED display device may be regarded as a next generation display device for a portable electronic devices.

In general, the OLED display device includes an OLED panel having organic emitting layers therein, a main frame surrounding an edge portion of the OLED panel, a bottom frame covering a rear surface of the OLED panel and a window covering and protecting a front surface of the OLED panel.

Recently, the OLED display device has been widely used for a monitor of a desktop computer and a wall-mountable television as well as a portable phone. In addition, the OLED having reduced weight and volume with an enlarged display area has been actively researched.

When the OLED panel, the main frame, the bottom frame and the window are assembled and combined, an assembly tolerance are required for the OLED display device. In addition, for the purpose of preventing a crack of the OLED panel during a test of thermal impact or reliability, a gap space is required among the OLED panel, the main frame and the bottom frame. As a result, a border gap is generated between the OLED panel and the main frame.

Since the border gap deteriorates an appearance of the OLED display device, an additional exterior case covers the border gap and surrounds the OLED display device for improving the appearance of the OLED display device. However, it is hard to obtain the OLED display device having a light weight and a thin profile due to the additional exterior case.

Further, since a process of assembling and combining the additional exterior case and the OLED display device is required, an efficiency of fabrication is reduced such that fabrication cost and fabrication time increase.

SUMMARY

Embodiments of the present disclosure relate to an organic light emitting diode display device. Accordingly, one embodiment is directed to an organic light emitting diode display device that substantially obviates one or more of the problems due to limitations and disadvantages of the related art.

One embodiment is an organic light emitting diode display device having an improved appearance.

In addition, one embodiment is an organic light emitting diode display device having a light weight and a thin profile.

Further, one embodiment is an organic light emitting diode display device, where an efficiency of fabrication is improved by reducing fabrication cost and simplifying fabrication.

An organic light emitting display assembly of the present disclosure includes an organic light emitting diode panel comprising a side surface, a front surface, and a rear edge surface opposing the front surface and a body frame disposed about the organic light emitting diode panel. The body frame includes a body vertical portion surrounding the side surface of the organic light emitting diode panel, the body vertical portion including a first vertical part and a second vertical part that together define an insertion groove, the first vertical part of the body vertical portion and the side surface of the organic light emitting diode panel defining a gap therebetween and a body horizontal portion perpendicularly connected to the body vertical portion, the body horizontal portion supporting the rear edge surface of the organic light emitting diode panel. The assembly also includes a cap frame that includes a cap vertical portion configured for insertion into the insertion groove of the body vertical portion of the body frame and a cap horizontal portion perpendicularly connected to the cap vertical portion, the cap horizontal portion having a first side surface that extends over the gap defined by the first vertical part and the side surface of the organic light emitting diode panel.

In one embodiment a width of the first side surface of the cap frame is from 1.5 to 2.5 times a thickness of the first vertical part of the body frame. In another embodiment the insertion groove is defined by the first vertical part and the second vertical part of the body vertical portion and includes a first width at a first vertical point within the insertion groove, a second width greater than the first width at a second vertical point within the insertion groove, and a third width less than the second width and greater than the first width at a third vertical point within the insertion groove. In one embodiment the cap vertical portion has a first thickness corresponding to the first width of the insertion groove at a first vertical point of the cap vertical portion, a second thickness corresponding to the second width of the insertion groove at a second vertical point of the cap vertical portion, and a third thickness corresponding to the third width of the insertion groove at a third vertical point of the cap vertical portion. In another embodiment the cap horizontal portion includes a second side surface having a width corresponding to a width of the second vertical part of the body frame.

In one embodiment, the first vertical part of the body vertical portion includes a top end opposite the body horizontal portion, the top end including a chamfer adjacent to the insertion groove. In one embodiment the cap vertical portion includes a bottom end opposite the cap horizontal portion, the bottom end including a chamfer on a side of the cap vertical portion corresponding to the first side surface of the cap horizontal portion. In one embodiment, the body horizontal portion includes a first surface proximate to the organic light emitting diode panel and a second surface opposite the first surface, the second surface of the body horizontal portion defining a step difference. In one embodiment, the organic light emitting display further includes a bottom frame having a height corresponding to a height of the step difference.

An organic light emitting display assembly includes an organic light emitting diode panel comprising a side surface, a front surface, and a rear edge surface opposing the front surface, a body frame disposed about the organic light emitting diode panel and a cap frame. The body frame further includes a body vertical portion surrounding the side surface of the organic light emitting diode panel, the body vertical portion and the side surface of the organic light emitting diode panel defining a gap therebetween and a body horizontal portion perpendicularly connected to the body vertical portion, the body horizontal portion supporting the rear edge surface of the organic light emitting diode panel. The cap frame further includes a cap vertical portion configured for attachment to the body vertical portion of the body frame and a cap horizontal portion perpendicularly connected to the cap vertical portion, the cap horizontal portion having a first side surface that extends over the gap defined by the body vertical portion and the side surface of the organic light emitting diode panel.

In one embodiment, a width of the first side surface of the cap frame is from 1.5 to 2.5 times a thickness of the vertical part of the body frame. In one embedment, the organic light emitting display further includes a radiating pad disposed between the organic light emitting diode panel and the body horizontal portion. In one embedment, the organic light emitting display further includes a window disposed over the organic light emitting diode panel. In one embodiment, the body vertical portion has a top end opposite the body horizontal portion, the top end including a chamfer. In one embodiment, the cap vertical portion includes a bottom end opposite the cap horizontal portion, the bottom end including a chamfer on a side of the cap vertical portion proximate to the organic light emitting diode panel. In one embodiment, the body horizontal portion comprises a first surface proximate to the organic light emitting diode panel and a second surface opposite the first surface, the second surface of the body horizontal portion defining a step difference. In one embodiment, the organic light emitting display further includes a bottom frame having a height corresponding to a height of the step difference.

An organic light emitting display assembly includes an organic light emitting diode panel comprising a side surface, a front surface, and a rear edge surface opposing the front surface, a body frame disposed about the organic light emitting diode panel and a cap frame. The body frame further includes a body vertical portion surrounding the side surface of the organic light emitting diode panel and a body horizontal portion perpendicularly connected to the body vertical portion, the body horizontal portion having a first surface proximate to the organic light emitting diode panel and a second surface opposite the first surface, the body horizontal portion supporting the rear edge surface of the organic light emitting diode panel, the second surface of the body horizontal portion defining a step difference. The cap frame further includes a cap vertical portion configured for attachment to the body vertical portion of the body frame and a cap horizontal portion perpendicularly connected to the cap vertical portion, the cap horizontal portion having a first side surface that extends over the side surface of the organic light emitting diode panel.

In one embodiment, the organic light emitting display assembly further includes comprising a bottom frame having a height corresponding to a height of the step difference. In one embodiment, a width of the first side surface of the cap frame is from 1.5 to 2.5 times a thickness of the vertical part of the body frame. In one embodiment, the body vertical portion comprises a top end opposite the body horizontal portion, the top end including a chamfer. In one embodiment, the cap vertical portion comprises a bottom end opposite the cap horizontal portion, the bottom end including a chamfer on a side of the cap vertical portion proximate to the organic light emitting diode panel.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment is It is to be understood that both the foregoing general description and the following detailed description are and explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
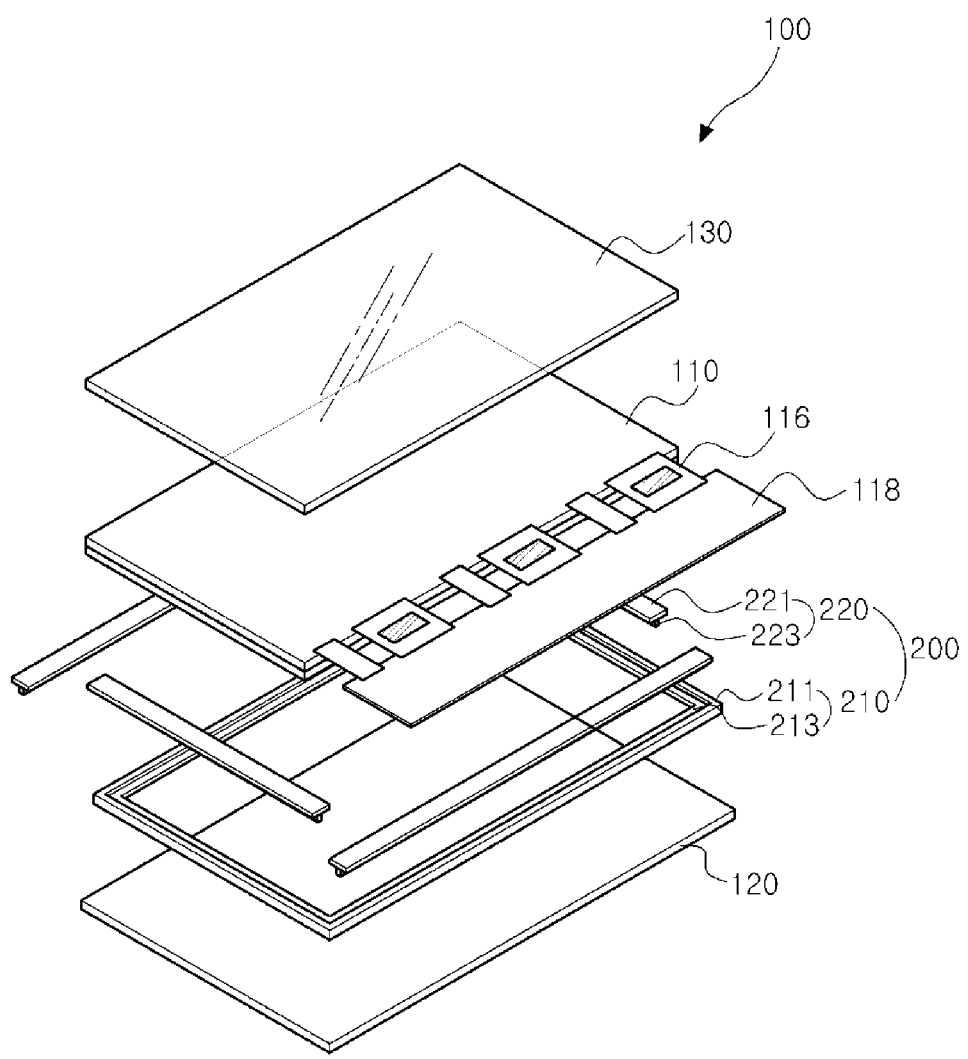
FIG. 1 is an exploded perspective view showing a light emitting diode display device according to an embodiment of the present disclosure.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
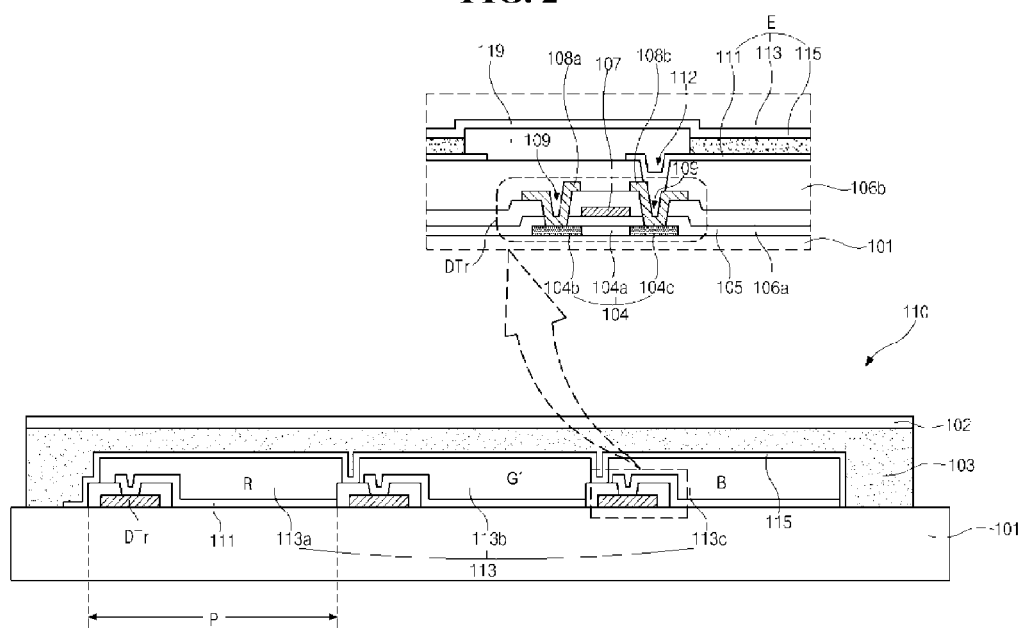
FIG. 2 is cross-sectional view showing an organic light emitting diode panel according to an embodiment of the present disclosure.

FIG. 1 is an exploded perspective view showing a light emitting diode display device according to an embodiment of the present disclosure, and FIG. 2 is cross-sectional view showing an organic light emitting diode panel according to an embodiment of the present disclosure.

In FIGS. 1 and 2, an organic light emitting diode (OLED) display device 100 may include an OLED panel 110 for displaying an image, a main frame 200 for guiding an edge portion of the OLED panel 110, a bottom frame 120 for covering a rear surface of the OLED panel 110 and a window 130 covering and protecting a front surface of the OLED panel 110.

The main frame 200 surrounds the edge portion of the OLED panel 110. The bottom frame 120 is disposed under the OLED panel 110 and the window 130 is disposed over the OLED panel 110. The OLED display device 100 is modularized by combining and assembling the main frame 200, the bottom frame 120 and the window with the OLED panel 110.

In FIG. 2, the OLED panel 110 includes first and second substrates 101 and 102. The second substrate 102 is attached to the first substrate 101 having a driving thin film transistor (TFT) DTr and a light emitting diode (LED) E. A semiconductor layer 104 having an active region 104a, a source region 104b and a drain region 104c is formed on the first substrate 101 in a pixel region P. The active region 104a is disposed at a center of the semiconductor layer 104 to constitute a channel of the driving TFT DTr. The source and drain regions 104b and 104c are doped with impurities and are disposed at both sides of the active region 104a.

A gate insulating layer 105 is formed on the semiconductor layer 104 and a gate electrode 107 is formed on the gate insulating layer 105 over the active region 104a. Although not shown, a gate line may be formed on the gate insulating layer 105.

An interlayer insulating layer 106a is formed on the gate electrode 107 and the gate line. The interlayer insulating layer 106a and the gate insulating layer 105 include first and second semiconductor contact holes 109 exposing the source and drain regions 104b and 404c, respectively.

A source electrode 108a and a drain electrode 108b are formed on the interlayer insulating layer 106a. The source and drain electrodes 108a and 108b are connected to the source and drain regions 104b and 104c, respectively, through the first and second semiconductor contact holes 109. Although not shown, a data line may be formed on the interlayer insulating layer 106a. The data line crosses the gate line to define the pixel region P.

A passivation layer 106b is formed on the source and drain electrodes 108a and 108b. The passivation layer 106b includes a drain contact hole 112 exposing the drain electrode 108b.

The semiconductor layer 104, the gate insulating layer 105, the source electrode 108a and the drain electrode 108b constitute the driving TFT DTr. Although not shown, a switching TFT having the same structure as the driving TFT DTr may be on the first substrate 101 to be connected to the driving TFT DTr. Although the driving TFT DTr and the switching TFT have a co-planar type in where the semiconductor layer 104 includes polycrystalline silicon in FIG. 2, the driving TFT DTr and the switching TFT may have an inverted staggered type where a semiconductor layer includes amorphous silicon and a gate electrode is disposed under the semiconductor layer in another embodiment.

A first electrode 111 connected to the drain electrode 108b through the drain contact hole 112 is formed on the passivation layer 106b in each pixel region P. The first electrode 111 may include a material having a relatively high work function to function as an anode of the LED E.

A bank layer 119 is formed on the first electrode 111. The bank layer 119 may cover an edge portion of the first electrode 111 to expose a central portion of the first electrode 111.

An organic emitting layer 113 is formed on the first electrode 111. The organic emitting layer 113 may have a single-layered structure of an emitting material or a multiple-layered structure including a hole injecting layer (HIL), a hole transporting layer (HTL), an emitting material layer (EML), an electron transporting layer (ETL) and an electron injecting layer (EIL).

The organic emitting layer 113 may emit light of red (R), green (G') and blue (B) colors. For example, the organic emitting layer 113 may include red, green and blue emitting layers 113a, 113b and 113c in each pixel region P.

A second electrode 115 is formed on the whole surface of the first substrate 101 having the organic emitting layer 113. The second electrode may include a material having a relatively low work function to function as a cathode.

The first electrode 111, the organic emitting layer 113 and the second electrode 115 may constitute the LED E. For example, the second electrode 115 may have a double-layered structure including a thin metallic layer and a transparent conductive layer on the thin metallic layer such that the OLED panel 110 has a top emission type where a light of the organic emitting layer 113 is emitted through the second electrode 115. In addition, the second electrode 115 may include an opaque metallic layer such that the OLED panel 110 has a bottom emission type where a light of the organic emitting layer 113 is emitted through the first electrode 111.

When a voltage is applied to the first and second electrodes 111 and 115, a hole from the first electrode 111 and an electron from the second electrode 115 are transported into the organic emitting layer 113 to generate an exciton and the exciton transitions from an excited state to a ground state to emit a visible light. The light is emitted through one of the first and second electrodes 111 and 115 and the OLED panel 110 displays an image.

An adhesive film 103 is formed on the driving TFT DTr and the LED E and the second substrate 102 is attached to the first substrate 101 by using the adhesive film 103. The second substrate 102 may be referred to as an encapsulation substrate.

The adhesive film 103 prevents an external moisture from penetrating into the LED E and protects the driving TFT DTr and the LED E. For example, the adhesive film 103 may include one of an optically clear adhesive (OCA), a heat curable resin and a heat curable sealant to seal the driving TFT DTr and the LED E.

The first and second substrates 101 and 102 may include one of a glass, a plastic, a stainless steel and a metal foil. When the first and second substrates 101 and 102 include a metal foil, the first and second substrates 101 and 102 may have a thickness of about 5 μm to about 100 μm. Since the first and second substrates 101 and 102 of a metal foil have a smaller thickness as compared with the first and second substrates 101 and 102 of a glass or a stainless steel, a thickness of the OLED panel 110 may be reduced. In addition, a durability of the OLED panel 110 is improved with a smaller thickness.

A printed circuit board (PCB) 118 is connected to a side of the OLED panel 110 through a connecting means 116 such as a flexible printed circuit (FPC) or a tape carrier package (TCP). Driving signals are supplied to the OLED panel 110 from driving circuit elements (not shown) on the PCB 118.

The OLED panel 110 is modularized with the main frame 200, the bottom frame 120 and the window 130.

The main frame 200 has a rectangular ring shape surrounding the edge portion of the OLED panel 110. In addition, the main frame 200 may include a body frame 210 and a cap frame 220. The body frame 210 includes a body vertical portion 211 surrounding a side surface of the OLED panel 110 and a body horizontal portion 213 supporting a rear edge surface of the OLED panel 110. The OLED panel 110 is disposed over the body horizontal portion 213 to be supported by the body horizontal portion 213. The body horizontal portion 213 may be perpendicularly connected to the body vertical portion 211 to be disposed inside the body vertical portion 211. The body vertical portion 211 may include an insertion groove 215 (of FIG. 3A).

The cap frame 220 may be disposed over the body frame 210. The cap frame 220 includes a cap horizontal portion 221 covering a top surface of the body vertical portion 211 of the body frame 210 and a cap vertical portion 223 inserted into the insertion groove 215 of the body vertical portion 211 of the body frame 210. The cap vertical portion 223 may be perpendicularly connected to the cap horizontal portion 221. An edge portion of the cap horizontal portion 221 of the cap frame 220 covers a border gap G (of FIG. 4A) between the OLED panel 110 and the body frame 210.

The main frame 200 including the body frame 210 and the cap frame 220 is disposed over the bottom frame 120. The bottom frame 120 may include a metallic material having a relatively high heat conductivity such as aluminum (Al), copper (Cu), zinc (Zn), silver (Ag), gold (Au), iron (Fe) and alloy thereof. For example, the bottom frame 120 may include aluminum having a relatively high heat conductivity, a relatively low weight and a relatively low cost. Alternatively, the bottom frame 120 may include an electrolytically galvanized iron (EGI).

The window 130 is disposed over the OLED panel 110. The window 130 may be attached to the OLED panel 110 by using a double-sided adhesive tape. The window 130 may protect the OLED panel 110 from an external impact and may transmit a light from the OLED panel 110 to display an image of the OLED panel 110. For example, the window 130 may include a material having a relatively high impact resistance and a relatively high transmittance such as a plastic (e.g. acryl) and a glass.

As a result, the OLED display device 100 is modularized by combining the main frame 200 surrounding the OLED panel 110, the bottom frame 120 disposed under the OLED panel 110 and the window disposed over the OLED panel 110. The border gap G between the OLED panel 110 and the body frame 210 is covered with the cap frame 220 assembled and combined to the body frame 210 such that the border gap G is not shown to a user.

The main frame 200 may be referred to as a cabinet, a guide panel, a support main or a mold frame, and the bottom frame 120 may be referred to as a cover bottom, a bottom cover or a lower cover.

In the OLED display device 100 according to an embodiment of the present disclosure, the main frame 200 guiding the edge portion of the OLED panel 110 has a dual structure including the body frame 210, which guides the edge portion of the OLED panel 110 and supports the rear edge surface of the OLED panel 110, and the cap frame 220, which is assembled and combined with the body frame 210 and covers the border gap G between the OLED panel 110 and the body frame 210.

Since the border gap G for an assembly tolerance of a process of assembling the OLED panel 110, the main frame 200, the bottom frame 120 and the window 130 or for a gap space among the OLED panel 110, the main frame 200 and the bottom frame 120 to prevent a crack of the OLED panel 110 during a test of thermal impact or reliability is covered with the cap frame 220 of the main frame 200, an appearance of the OLED display device 100 is improved. In addition, an interior and a design of the OLED display device 100 are improved without an additional exterior case and the OLED display device 100 has a light weight and a thin profile. Further, efficiency of fabrication for the OLED display device 100 is improved by reducing fabrication cost and fabrication time.

Figure 3A:
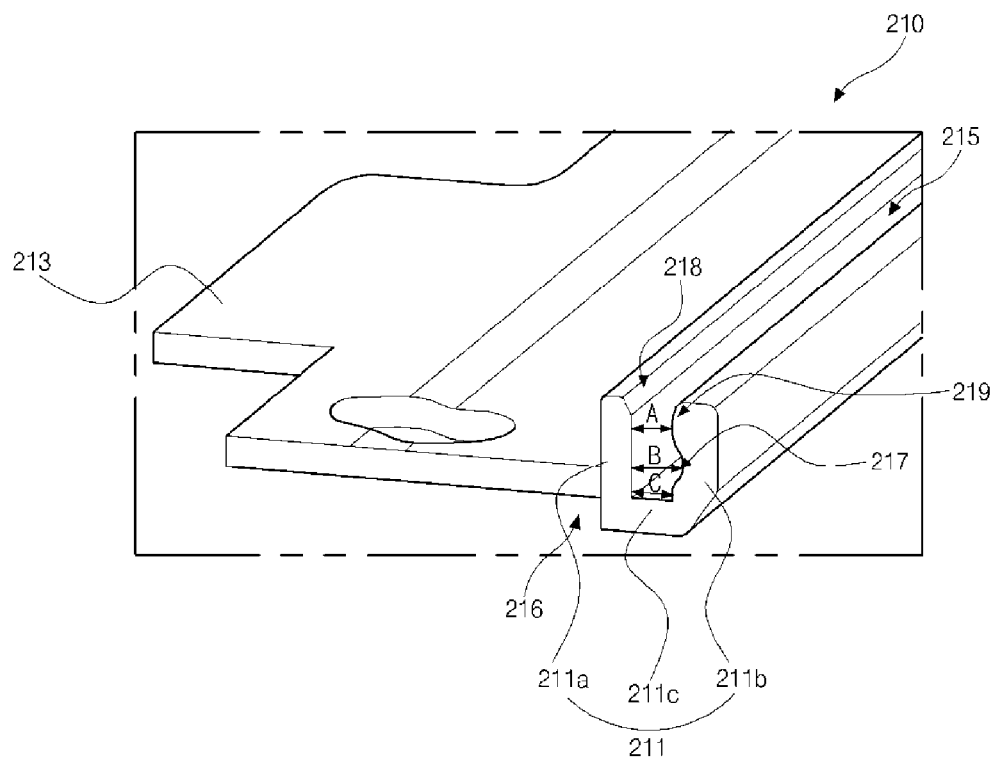
FIG. 3A is a perspective view showing a body frame of a main frame according to an embodiment of the present disclosure.
Figure 3B:
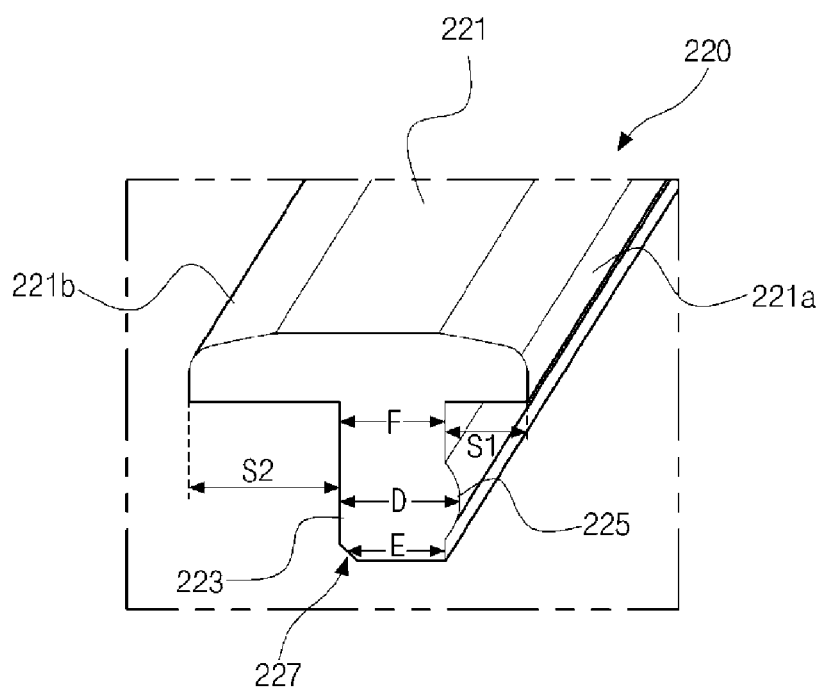
FIG. 3B is a perspective view showing a cap frame of a main frame according to an embodiment of the present disclosure.
Figure 3C:
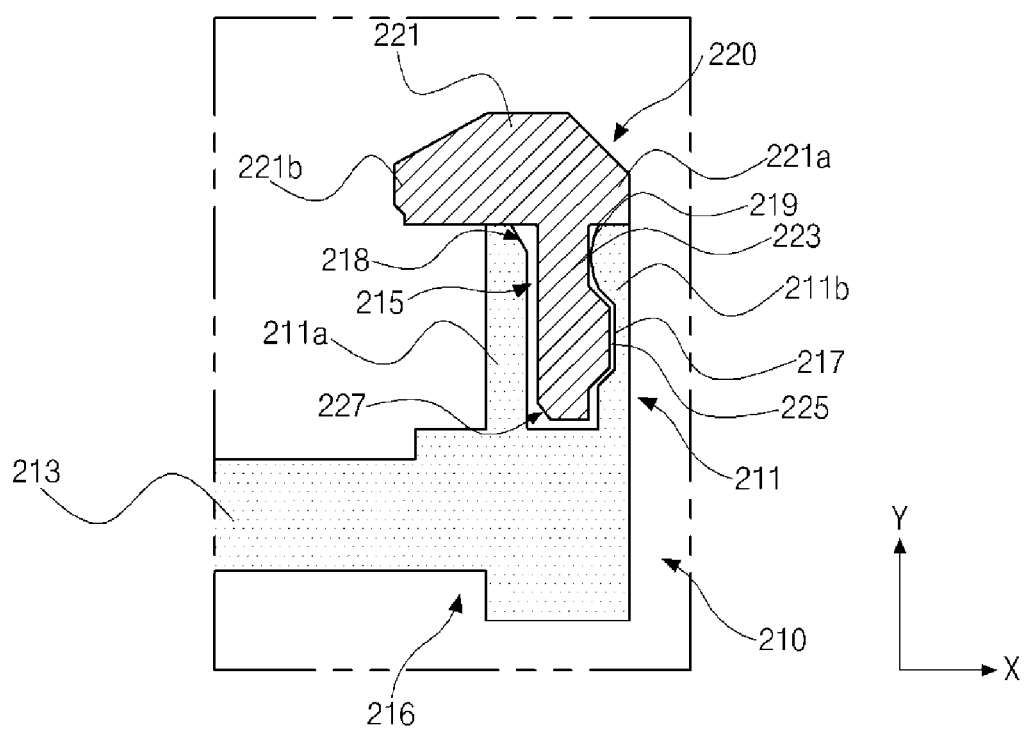
FIG. 3C is a cross-sectional view showing a body frame and a cap frame assembled and combined with each other according to an embodiment of the present disclosure.

FIGS. 3A and 3B are perspective views showing a body frame and a cap frame, respectively, of a main frame according to an embodiment of the present disclosure, and FIG. 3C is a cross-sectional view showing a body frame and a cap frame assembled and combined with each other according to an embodiment of the present disclosure.

In FIG. 3A, the main frame 200 (of FIG. 1) has a rectangular ring shape surrounding the edge portion of OLED panel 110 (of FIG. 1) and has a dual structure including the body frame 210 and the cap frame 220. The body frame 210 includes the body vertical portion 211 and the body horizontal portion 213 perpendicularly bent from the body vertical portion 211.

The body vertical portion 211 may include first and second vertical parts 211a and 211b facing and spaced apart from each other and a horizontal part 211c connecting and perpendicular to the first and second vertical parts 211a and 211b. The first and second vertical parts 211a and 211b and the horizontal part 211c constitute an insertion groove 215 of the body vertical portion 211.

An assembly groove 217 is formed on an inner surface of the second vertical part 211b facing the first vertical part 211a, and a body protrusion 219 having a round convex shape toward the first vertical part 211a is formed at an upper portion of the assembly groove 217. In addition, an edge of the first vertical part 211a facing the second vertical part 211b is removed to form a body chamfer 218.

Accordingly, the insertion groove 215 may have three widths different from each other. For example, the assembly groove 217 may have a first width A between the body chamfer 218 and the body protrusion 219 at an upper portion thereof, a second width B between the first vertical part 211a and the assembly groove 217 at a central portion thereof, and a third width C between the first vertical part 211a and the second vertical part 211b at a lower portion thereof. The third width C may be smaller than the second width B and may be greater than the first width A.

A bottom surface of the body horizontal portion 213 is formed to be closer to the top surface of the first and second vertical parts 211a and 211b of the body vertical portion 211 than a bottom surface of the horizontal part 211c of the body vertical portion 211 such that the horizontal part 211c of the body vertical portion 211 and the body horizontal portion 213 form a step difference 216. The step difference 216 may have a height corresponding to a thickness of the bottom frame 120 (of FIG. 1).

In FIG. 3B, the cap frame 220 includes the cap horizontal portion 221 parallel to the body horizontal portion 213 and the horizontal part 211c of the body vertical portion 211 and the cap vertical portion 223 perpendicularly bent from the cap horizontal portion 221 such that the cap frame 220 may have a "T" shape in a cross-sectional view.

The cap horizontal portion 221 may have first and second side surfaces 221a and 221b opposite to each other. A first distance S1 between the first side surface 221a and a first side surface of the cap vertical portion 223 may correspond to a thickness of the second vertical part 211b of the body frame 210, and a second distance S2 between the second side surface 221b and a second side surface of the cap vertical portion 223 may correspond to about 1.5 times to about 2.5 times of a thickness of the first vertical part 211a of the body frame 210.

A cap protrusion 225 is formed on the side surface of the cap vertical portion 223 of the cap frame 220 facing the second vertical part 211b of the body vertical portion 211 of the body frame 210. In addition, an edge of the cap vertical portion 223 opposite to the cap protrusion 225 is removed to form a cap chamfer 227.

Accordingly, the cap vertical portion 223 of the cap frame 220 may have three widths different from each other. For example, the cap vertical portion 223 may have a fourth width D at a central portion thereof, a fifth width E at a lower portion thereof, and a sixth width F at an upper portion thereof. The sixth width F may be smaller than the fourth width D and may be greater than the fifth width E.

For example, the body frame 210 and the cap frame 220 may include one of aluminum (Al), copper (Cu), zinc (Zn), silver (Ag), gold (Au), iron (Fe) and alloy thereof. In addition, the body frame 210 and the cap frame 220 may include an electrolytically galvanized iron (EGI). Alternatively, the body frame 210 and the cap frame 220 may include one of polycarbonate (PC), acrylonitrile butadiene styrene (ABS) and polymethylmethacrylate (PMMA).

In FIG. 3C, the body frame 210 and the cap frame 220 are assembled and combined with each other such that the cap vertical portion 223 of the cap frame 220 is inserted into the insertion groove 215 of the body vertical portion 211 of the body frame 210. The cap protrusion 225 of the cap frame 220 may be inserted into the assembly groove 217 of the second vertical part 211b of the body vertical portion 211 of the body frame 210 during a process of inserting the cap vertical portion 223 of the cap frame 220 into the insertion groove 215 of the body frame 210.

For example, the fourth width D of the cap vertical portion 223 may correspond to the second width B of the insertion groove 215 of body vertical portion 211. The fifth width E of the cap vertical portion 223 may correspond to the first width A of the insertion groove 215 of body vertical portion 211. In addition, the sixth width F of the cap vertical portion 223 may correspond to the third width C of the insertion groove 215 of body vertical portion 211.

Accordingly, when the body frame 210 and the cap frame 220 are combined by a fitting method, the cap vertical portion 223 of the cap frame 220 may be easily inserted into the insertion groove 215 of the body vertical portion 211 of the body frame 210 due to the body protrusion 219, the body chamfer 218 and the cap chamfer 227. Further, since the cap vertical portion 223 may not be easily detached from the insertion groove 215 due to the body protrusion 219, the body chamfer 218 and the cap chamfer 227, detachment of the cap frame 220 from the body frame 210 along a y-direction Y may be prevented.

Figure 4A:
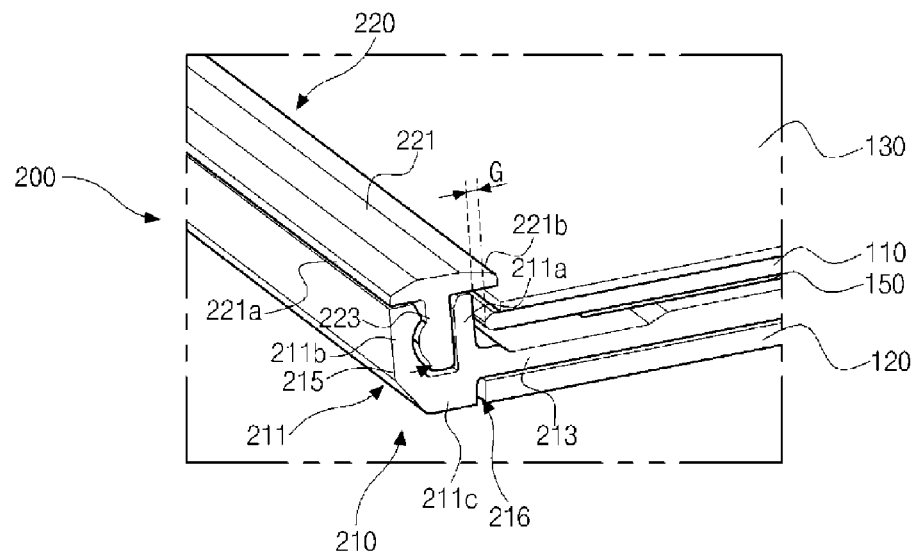
FIG. 4A is a perspective view showing an organic light emitting diode display device according to an embodiment of the present disclosure.
Figure 4B:
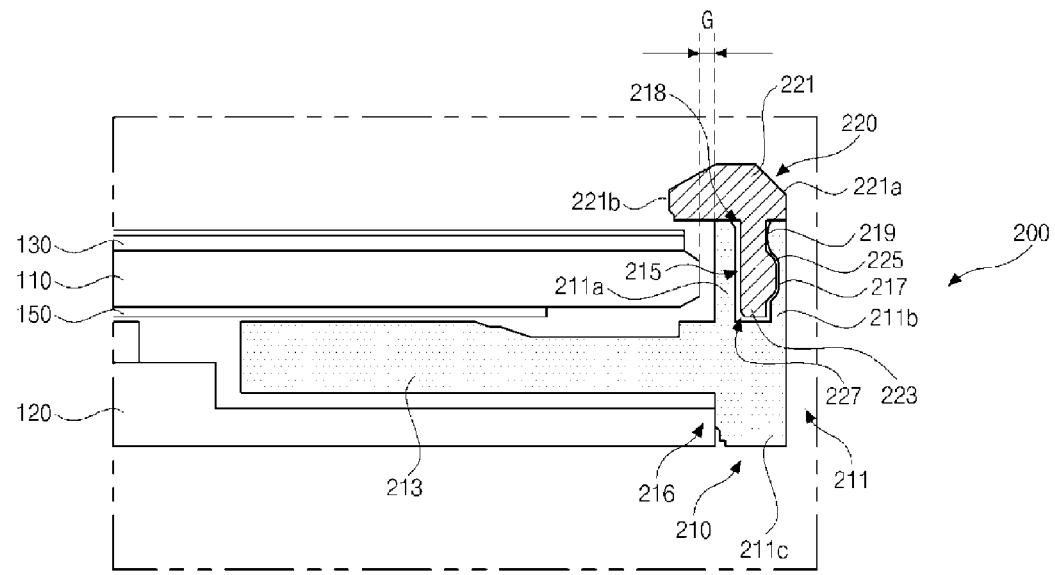
FIG. 4B is a cross-sectional view showing an organic light emitting diode display device according to an embodiment of the present disclosure.

FIGS. 4A and 4B are a perspective view and a cross-sectional view, respectively, showing an organic light emitting diode display device according to an embodiment of the present disclosure.

In FIGS. 4A and 4B, the OLED panel 110 and the body horizontal portion 213 of the body frame 210 may be attached to the bottom frame 120 by using a double-sided adhesive tape (not shown). The bottom frame 120 may be aligned to and guided by the step difference 216 between the body horizontal portion 213 and the horizontal part 211c of the body vertical portion 211.

As a result, a rear surface of the bottom frame 120 and a rear surface of the horizontal part 211c may be flush with each other to improve an appearance of the OLED display device 100 (of FIG. 1). In addition, since the bottom frame 120 may be easily disposed at a required position due to the step difference 216 during a process of attaching the bottom frame 120 to the OLED panel 110, an efficiency of fabrication is improved.

The window 130 may be attached and fixed to the OLED panel 110 by using a double-sided adhesive tape (not shown). The border gap G is generated between the OLED panel 110 and the main frame 200. The border gap G is required for an assembly tolerance of a process of assembling the OLED panel 110, the main frame 200, the bottom frame 120 and the window 130 or for a gap space among the OLED panel 110, the main frame 200 and the bottom frame 120 to prevent a crack of the OLED panel 110 during a test of thermal impact or reliability.

Since the main frame 200 has a dual structure of the body frame 210 having the insertion groove 215 by the first and second vertical parts 211a and 211b and the cap frame 220 having a "T" shape, the border gap G between the first vertical part 211a of the body frame 210 and the OLED panel 110 is covered with the cap frame 220. As a result, an appearance of the OLED display device 100 is improved.

When the body frame 210 and the cap frame 220 are combined with each other, the second side surface 221b of the cap horizontal portion 221 of the cap frame 220 is disposed toward the OLED panel 110 and the cap vertical portion 223 of the cap frame 220 is inserted into the insertion groove 215 of the body frame 210. Since the second distance S2 (of FIG. 3B) between the second side surface 221b of the cap horizontal portion 221 and the second side surface of the cap vertical portion 223 corresponds to about 1.5 times to about 2.5 times of a thickness of the first vertical part 211a of the body frame 210, the second side surface 221b of the cap horizontal portion 221 protrudes outside the first vertical part 211a of the body frame 210. As a result, the second side surface 221b of the cap horizontal portion 221 covers the border gap G between the OLED panel 110 and the first vertical part 211a.

Since an appearance of the OLED display device 100 is improved, an interior and a design of the OLED display device 100 are improved without an additional exterior case. In addition, the OLED display device 100 having a light weight and a thin profile is obtained by omitting an additional exterior case. Further, efficiency of fabrication for the OLED display device 100 is improved by reducing fabrication cost and fabrication time.

When the cap vertical portion 223 of the cap frame 220 is inserted into the insertion groove 215 of the body frame 210, the cap protrusion 225 of the cap vertical portion 223 is inserted into the assembly groove 217 of the second vertical part 211b. Since the cap vertical portion 223 is not easily detached from the insertion groove 215 due to the cap protrusion 225 and the assembly groove 217, the body frame 210 and the cap frame 220 are stably assembled and combined with each other.

Figure 5A:
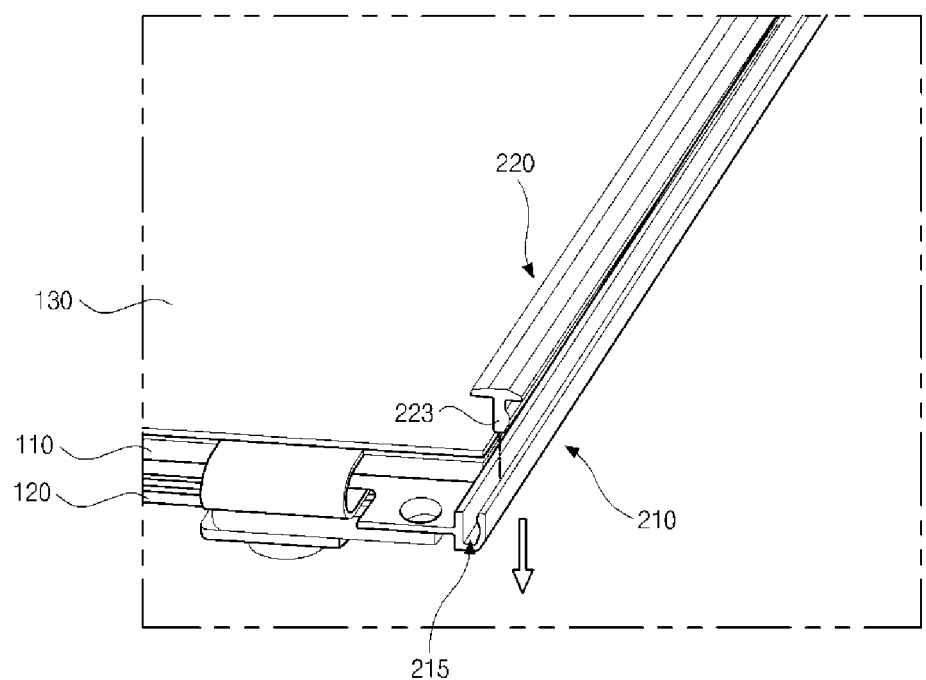
FIG. 5A is a perspective view showing a fitting method for combining a body frame and a cap frame according to an embodiment of the present disclosure.
Figure 5B:
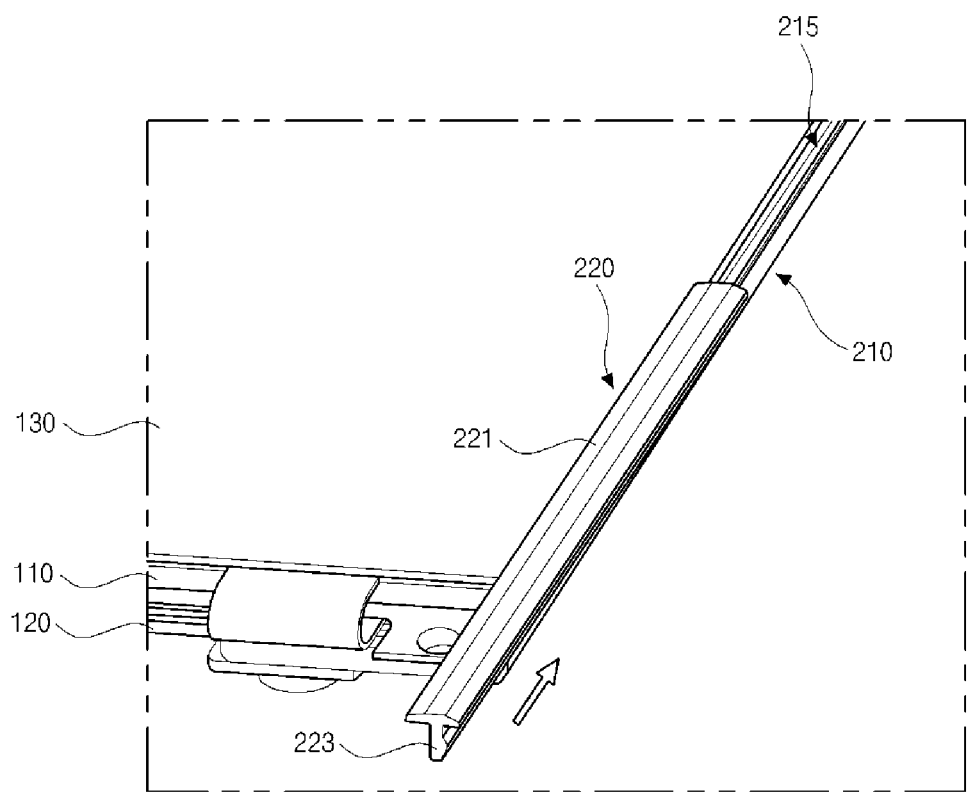
FIG. 5B is a perspective view showing a sliding method for combining a body frame and a cap frame according to an embodiment of the present disclosure.

FIGS. 5A and 5B are perspective views showing a fitting method and a sliding method, respectively, for combining a body frame and a cap frame according to an embodiment of the present disclosure.

In FIG. 5A, the cap vertical portion 223 of the cap frame 220 is inserted into the insertion groove 215 of the body frame 210 by a fitting method where the cap frame 220 is pushed toward the body frame 210. When the cap frame 220 is combined with the body frame 210 by a fitting method, the cap vertical portion 223 of the cap frame 220 may be easily inserted into the insertion groove 215 of the body frame 210 due to the body protrusion 219 and the body chamfer 218 constituting the first width A (of FIG. 3A) and the cap chamfer 227.

In FIG. 5B, the cap vertical portion 223 of the cap frame 220 is inserted into the insertion groove 215 of the body frame 210 by a sliding method where the cap frame 220 slides from one end of the body frame 210. When the cap frame 220 is combined with the body frame 210 by a sliding method, the cap vertical portion 223 of the cap frame 220 may be easily inserted into the insertion groove 215 of the body frame 210 by sliding the cap vertical portion 223 along the insertion groove 215. In addition, since the cap frame 220 is easily detached from the body frame 210 by a sliding method, the cap frames 220 having various colors may be adopted for the OLED display device 100 according to user's selection. As a result, an interior and a design of the OLED display device 100 are further improved.

In the OLED display device 100 according to an embodiment of the present disclosure, since the main frame 200 has a dual structure of the body frame 210 having the insertion groove 215 by the first and second vertical parts 211a and 211b and the cap frame 220 having a "T" shape, the border gap G between the body frame 200 and the OLED panel 110 is covered with the cap frame 220. As a result, an appearance of the OLED display device 100 is improved. In addition, an interior and a design of the OLED display device 100 are improved without an additional exterior case and the OLED display device 100 having a light weight and a thin profile is obtained. Further, efficiency of fabrication for the OLED display device 100 is improved by reducing fabrication cost and fabrication time.

Moreover, a heat of high temperature generated from the OLED panel 110 is effectively radiated to an exterior by disposing a radiating plate 150 under the OLED panel 110. For example, the radiating plate 150 may include a radiating pad or a radiating metal plate. While the OLED panel 110 is driven, the OLED panel 110 may have a temperature of about 80° C. to about 90° C. by the heat generated from the driving TFT DTr (of FIG. 2) and a lifetime of the OLED display device 100 is reduced due to the heat of high temperature. To radiate the heat generated from the OLED panel 110 promptly, the radiating plate 150 of a radiating pad or a radiating metal plate is disposed under the OLED panel 110. As a result, a reliability of the OLED display device 100 is improved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An organic light emitting display assembly comprising:
   an organic light emitting diode panel comprising a side surface, a front surface, and a rear edge surface opposing the front surface;
   a body frame disposed about the organic light emitting diode panel, the body frame comprising:
      a body vertical portion surrounding the side surface of the organic light emitting diode panel, the body vertical portion including a first vertical part and a second vertical part that together define an insertion groove, the first vertical part of the body vertical portion and the side surface of the organic light emitting diode panel defining a gap therebetween;
      a body horizontal portion perpendicularly connected to the body vertical portion, the body horizontal portion supporting the rear edge surface of the organic light emitting diode panel;
   a cap frame comprising:
      a cap vertical portion configured for insertion into the insertion groove of the body vertical portion of the body frame; and
      a cap horizontal portion perpendicularly connected to the cap vertical portion, the cap horizontal portion having a first side surface that extends over the gap defined by the first vertical part and the side surface of the organic light emitting diode panel.

2. The organic light emitting display assembly of claim 1, wherein a width of the first side surface of the cap frame is from 1.5 to 2.5 times a thickness of the first vertical part of the body frame.

3. The organic light emitting display assembly of claim 1, wherein the insertion groove defined by the first vertical part and the second vertical part of the body vertical portion includes a first width at a first vertical point within the insertion groove, a second width greater than the first width at a second vertical point within the insertion groove, and a third width less than the second width and greater than the first width at a third vertical point within the insertion groove.

4. The organic light emitting display assembly of claim 3, wherein the cap vertical portion has a first thickness corresponding to the first width of the insertion groove at a first vertical point of the cap vertical portion, a second thickness corresponding to the second width of the insertion groove at a second vertical point of the cap vertical portion, and a third thickness corresponding to the third width of the insertion groove at a third vertical point of the cap vertical portion.

5. The organic light emitting display assembly of claim 1, wherein the cap horizontal portion includes a second side surface having a width corresponding to a width of the second vertical part of the body frame.

6. The organic light emitting display assembly of claim 1, wherein the first vertical part of the body vertical portion comprises a top end opposite the body horizontal portion, the top end including a chamfer adjacent to the insertion groove.

7. The organic light emitting display assembly of claim 1, wherein the cap vertical portion comprises a bottom end opposite the cap horizontal portion, the bottom end including a chamfer on a side of the cap vertical portion corresponding to the first side surface of the cap horizontal portion.

8. The organic light emitting display assembly of claim 1, wherein the body horizontal portion comprises a first surface proximate to the organic light emitting diode panel and a second surface opposite the first surface, the second surface of the body horizontal portion defining a step difference.

9. The organic light emitting display assembly of claim 8, further comprising a bottom frame having a height corresponding to a height of the step difference.

10. An organic light emitting display assembly comprising:
- an organic light emitting diode panel comprising a side surface, a front surface, and a rear edge surface opposing the front surface;
- a body frame disposed about the organic light emitting diode panel, the body frame comprising:
  - a body vertical portion surrounding the side surface of the organic light emitting diode panel, the body vertical portion and the side surface of the organic light emitting diode panel defining a gap therebetween;
  - a body horizontal portion perpendicularly connected to the body vertical portion, the body horizontal portion having a first surface proximate to the organic light emitting diode panel and a second surface opposite the first surface, the body horizontal portion supporting the rear edge surface of the organic light emitting diode panel, the second surface of the body horizontal portion defining a step difference with respect to a bottom surface of the body vertical portion, in which the step difference steps up from the bottom surface of the body vertical portion towards a center of the body frame;
- a cap frame comprising:
  - a cap vertical portion configured for attachment to the body vertical portion of the body frame; and
  - a cap horizontal portion perpendicularly connected to the cap vertical portion, the cap horizontal portion having a first side surface that extends over the gap defined by the body vertical portion and the side surface of the organic light emitting diode panel.

11. The organic light emitting display assembly of claim 10, wherein a width of the first side surface of the cap frame is from 1.5 to 2.5 times a thickness of the body vertical portion of the body frame.

12. The organic light emitting display assembly of claim 10, further comprising a radiating pad disposed between the organic light emitting diode panel and the body horizontal portion.

13. The organic light emitting display assembly of claim 10, further comprising a window disposed over the organic light emitting diode panel.

14. The organic light emitting display assembly of claim 10, wherein the body vertical portion comprises a top end opposite the body horizontal portion, the top end including a chamfer.

15. The organic light emitting display assembly of claim 10, wherein the cap vertical portion comprises a bottom end opposite the cap horizontal portion, the bottom end including a chamfer on a side of the cap vertical portion proximate closer to the organic light emitting diode panel.

16. The organic light emitting display assembly of claim 10, further comprising a bottom frame having a height corresponding to a height of the step difference.

17. An organic light emitting display assembly comprising:
- an organic light emitting diode panel comprising a side surface, a front surface, and a rear edge surface opposing the front surface;
- a body frame disposed about the organic light emitting diode panel, the body frame comprising:
  - a body vertical portion surrounding the side surface of the organic light emitting diode panel;
  - a body horizontal portion perpendicularly connected to the body vertical portion, the body horizontal portion having a first surface proximate to the organic light emitting diode panel and a second surface opposite the first surface, the body horizontal portion supporting the rear edge surface of the organic light emitting diode panel, the second surface of the body horizontal portion defining a step difference with respect to a bottom surface of the body vertical portion, in which the step difference steps up from the bottom surface of the body vertical portion towards a center of the body frame;
- a cap frame comprising:
  - a cap vertical portion configured for attachment to the body vertical portion of the body frame; and
  - a cap horizontal portion perpendicularly connected to the cap vertical portion, the cap horizontal portion having a first side surface that extends over the side surface of the organic light emitting diode panel.

18. The organic light emitting display assembly of claim 17, further comprising a bottom frame having a height corresponding to a height of the step difference.

19. The organic light emitting display assembly of claim 17, wherein a width of the first side surface of the cap frame is from 1.5 to 2.5 times a thickness of the body vertical portion of the body frame.

* * * * *